United States Patent [19]
Kumagai

[11] Patent Number: 5,608,240
[45] Date of Patent: Mar. 4, 1997

[54] SEMICONDUCTOR INTEGRATED CIRCUIT HAVING AT LEAST ONE ASYMMETRICAL CMOS TRANSISTOR

[75] Inventor: Kouichi Kumagai, Tokyo, Japan

[73] Assignee: NEC Corporation, Japan

[21] Appl. No.: 347,517

[22] Filed: Nov. 30, 1994

[30]  Foreign Application Priority Data

Dec. 1, 1993 [JP] Japan ................................. 5-301392

[51] Int. Cl.⁶ .................................................. H01L 27/10
[52] U.S. Cl. ........................ 257/204; 257/206; 257/336; 257/338; 257/344; 257/408
[58] Field of Search ................................. 257/202, 204, 257/206, 336, 338, 344, 408, 409, 339

[56]  References Cited

FOREIGN PATENT DOCUMENTS

| | | | |
|---|---|---|---|
| 62-200757 | 9/1987 | Japan | 257/408 |
| 1-81360 | 3/1989 | Japan | 257/344 |

*Primary Examiner*—Minhloan Tran

[57]  ABSTRACT

The invention provides a semiconductor integrated circuit including a substrate, and a plurality of block cells arranged on the substrate and including a plurality of basic cells. Each of the basic cells includes a plurality of CMOS transistors. At least one of the CMOS transistors is an asymmetrical one in which one of a source diffusion layer or a drain diffusion layer has a lightly doped drain (LDD) structure or a deep doped drain (DDD) structure.

4 Claims, 10 Drawing Sheets

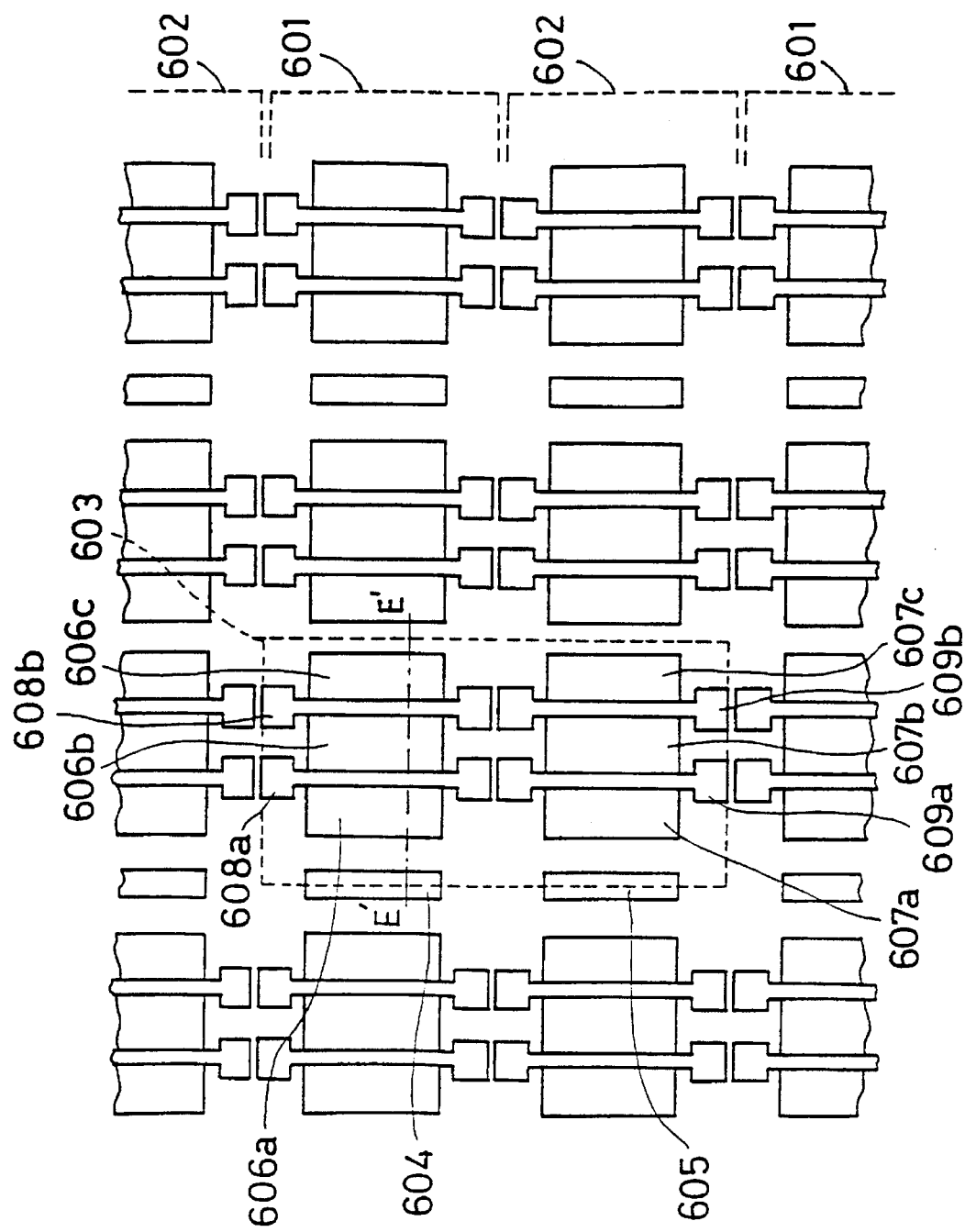

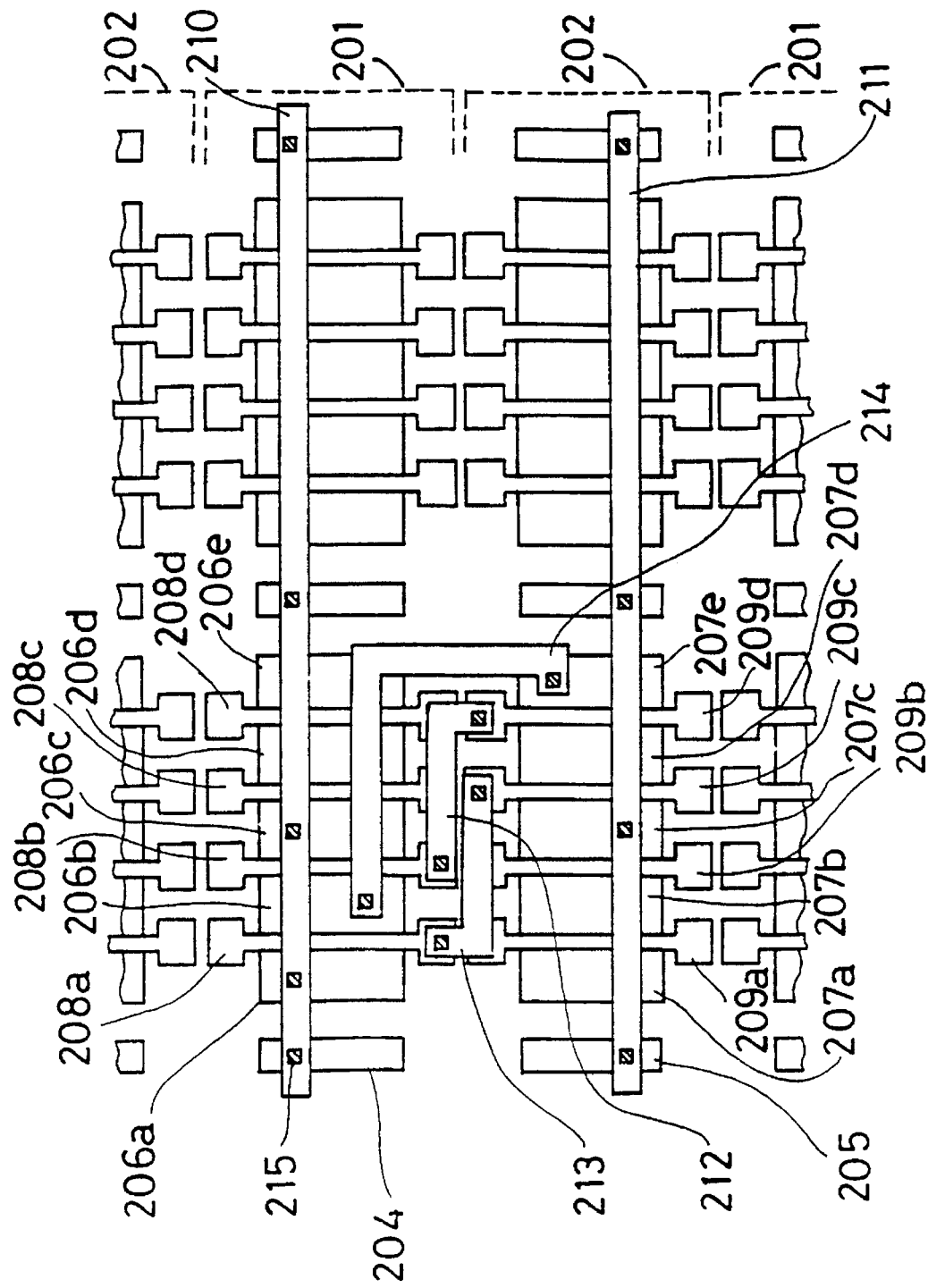

SEMICONDUCTOR INTEGRATED CIRCUIT HAVING AT LEAST ONE ASYMMETRICAL CMOS TRANSISTOR

BACKGROUND OF THE INVENTION

1. Field of the Invention

The invention relates to a semiconductor integrated circuit, and more particularly to a CMOS semiconductor integrated circuit of a gate array type or a standard cell type.

2. Description of the Related Art

A transistor having a lightly doped drain (LDD) structure is quite often used in recent CMOS logic LSI in order to prevent that the transistor's performance is deteriorated due to the presence of hot carriers. A LDD transistor is provided with an area having a lower concentration of impurities than a source/drain area between the source/drain area and a channel area located beneath a gate or side walls, to thereby suppress the generation of hot carriers.

In an application specific IC (ASIC) such as a sea-of-gates (SOG) gate array and a standard cell type LSI, all of LDD transistors included in an internal basic cell are provide with an LDD area at both source and drain sides. Namely, a source and a drain have a symmetrical structure with respect to a gate.

Such a symmetrical structure makes it possible to use a diffusion layer, in which a MOS transistor is formed, as a source or a drain in LSI, more particularly in random logic of an SOG gate array or a standard cell, in which a transistor array is in advance formed on a silicon wafer, and then a logic is constituted by patterning lead wires. This reduces the number of transistors to be used in a basic cell, and thereby reduces a size of a basic cell.

On the other hand, once a circuit structure has been defined by patterning of lead wires in a conventional basic cell as above mentioned, the basic cell would have an LDD area at a source side, which LDD area does not contribute to the enhancement of the resistance of a basic cell against hot carrier resistance. This LDD area reduces an amount of on-current and further retards an operation speed of a basic cell due to a presence of a resistance located in the LDD area at a source side.

FIG. 1 schematically illustrates resistors of a P-channel MOS transistor having LDD structures located symmetrically about a gate.

In an LDD transistor, an LDD area is formed by ion implantation after a gate has been patterned, and source and drain areas are formed by ion implantation of a source and a drain after sidewalls have been formed. Between a source 804 and a drain 805 both of which are in "on" condition, five resistors are connected in series with each other; namely, a source contact resistor and source diffusion layer resistor 812, a resistor 813 of an LDD area at the side of a source, a channel resistor 814, a resistor 815 of an LDD area at the side of a drain, and a drain contact resistor and drain diffusion layer resistor 816.

Presently, in a transistor having a gate which is 0.5 μm long, when a transistor is in "on" condition, the resistors 813 and 815 located in the LDD area reach about 10% at one side relative to total resistances located between a source and a drain. Accordingly, if the resistors located in the LDD area at the side of a source are eliminated and a source diffusion layer is extended to beneath a sidewall located at a source side, it would be possible to increase on-current corresponding to the above mentioned "10%" of the resistors.

With reference to FIG. 2 illustrating a layout of a basic cell array of a conventional CMOS transistor SOG, a conventional basic cell 603 comprises two P-channel MOS transistors 608a and 608b and two N-channel MOS transistors 609a and 609b. With reference to FIG. 3 which is a cross-sectional view of the P-channel MOS transistor taken along the line A—A in FIG. 2, the illustrated conventional semiconductor integrated circuit has a P-type substrate 610 and an N-well 611 formed on the P-substrate 610. To the N-well 611 is supplied a source voltage from an N-well contact diffusion layer 604. The two P-channel MOS transistors 608a and 608b share a P+ diffusion layer 606b to thereby be connected in series with each other. Each of P-channel MOS transistors 608a and 608b has sidewalls 613 at opposite sides of a gate. Beneath the sidewalls 613 are formed P-LDD areas 614. Each of the N-channel MOS transistors 609a and 609b in the basic cell 603 has the same structure as the P-channel MOS transistor 608a or 608b.

FIG. 4 illustrates an embodiment of double inputs NAND formed on the basic cell array illustrated in FIG. 2, and FIG. 5 illustrates an equivalent circuit to a circuit of FIG. 4. In FIG. 5, two P-channel MOS transistors 708a and 708b are connected in parallel with each other between a power source 710 and an output terminal 714. Namely, there is added at a side of a source to the circuit of FIG. 5 an LDD resistor which does not contribute to the enhancement of the resistance against hot carriers. This source-side LDD resistor reduces the drivability of the circuit and also retards the operation speed of the circuit.

As having explained so far, a conventional cell has a structure in which the impurities concentration is distributed symmetrically about a gate between a source and a drain of a transistor. Consequently, there must be formed at a side of a source an LDD area which does not contribute to the enhancement of the resistance of a transistor against hot carriers. The resistors in the source-side LDD area are connected in series with a source and a drain when a transistor is being operated, and thereby an on-current of a transistor is reduced correspondingly to the source-side LDD resistors, and the operation speed of a transistor is retarded.

SUMMARY OF THE INVENTION

It is an object of the present invention to provide a semiconductor integrated circuit for avoiding the reduction of on-current and the retardation of an operating speed of a circuit due to a presence of resistors located in LDD areas.

The invention provides a semiconductor integrated circuit including a substrate, and a plurality of block cells arranged on the substrate and including a plurality of basic cells, each of the basic cells including a plurality of CMOS transistors. At least one of the CMOS transistors has an asymmetrical structure in which only a drain diffusion layer has a lightly doped drain structure.

The invention also provides a semiconductor integrated circuit including a substrate, and a plurality of block cells arranged on the substrate and including a plurality of basic cells, each of the basic cells including a plurality of CMOS transistors. At least one of the CMOS transistors has an asymmetrical structure in which a source diffusion layer is extended to be located beneath a sidewall on a source side, and a lightly doped drain (LDD) structure or a double diffused drain (DDD) structure being beneath a sidewall on a drain side.

In a preferred embodiment, the semiconductor integrated circuit is of a gate array type or a standard cell type.

In another preferred embodiment, at least one of the CMOS transistors is a first symmetrical CMOS transistor in which both a source diffusion layer and a drain diffusion layer have a lightly doped drain (LDD) structure or a double diffused drain (DDD) structure. As an alternative thereto, at least one of the CMOS transistors is a first symmetrical CMOS transistor in which both a source diffusion layer and a drain diffusion layer are formed so that they are not located beneath sidewalls of a source and a drain, and so that they have a lightly doped drain (LDD) structure or a double diffused drain (DDD) s structure beneath the sidewalls of a source and a drain.

In still another preferred embodiment, at least one of the CMOS transistors is a second symmetrical CMOS transistor in which both a source diffusion layer and a drain diffusion layer have a single drain structure.

In yet another preferred embodiment, each of the basic cells includes a larger number of the asymmetrical CMOS transistors than the first symmetrical CMOS transistors.

In still yet another preferred embodiment, each of the basic cells includes a larger number of the asymmetrical CMOS transistors than the second symmetrical CMOS transistors.

In further preferred embodiment, each of the basic cells includes a larger number of the asymmetrical CMOS transistors than a total number of the first and second symmetrical CMOS transistors.

In further preferred embodiment, each of the CMOS transistors includes P-channel CMOS transistors and N-channel CMOS transistors.

The advantages obtained by the aforementioned present invention will be described hereinbelow.

In the semiconductor integrated circuit in accordance with the invention, an internal basic cell has at least one asymmetrical LDD transistor. By eliminating resistors located in an LDD area located at a side of a source or a drain, it is possible to increase an operating speed of the circuit.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 2 is a top plan view illustrating a conventional SOG basic cell array.

FIG. 10 is a top plan view illustrating a circuit in accordance with the first embodiment, applied to a double inputs NAND circuit.

DESCRIPTION OF THE PREFERRED EMBODIMENTS

Preferred embodiments in accordance with the present invention will be explained hereinbelow with reference to drawings.

Figure 1:
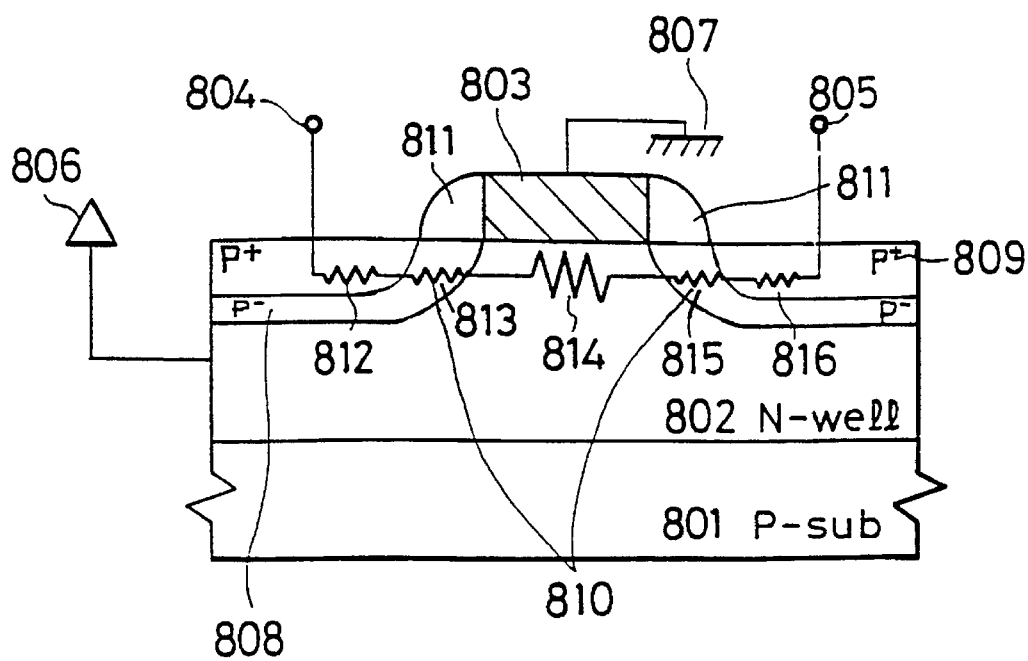
FIG. 1 is a schematic view illustrating a conventional LDD transistor having a symmetrical structure and including a plurality of resistors.
Figure 6:
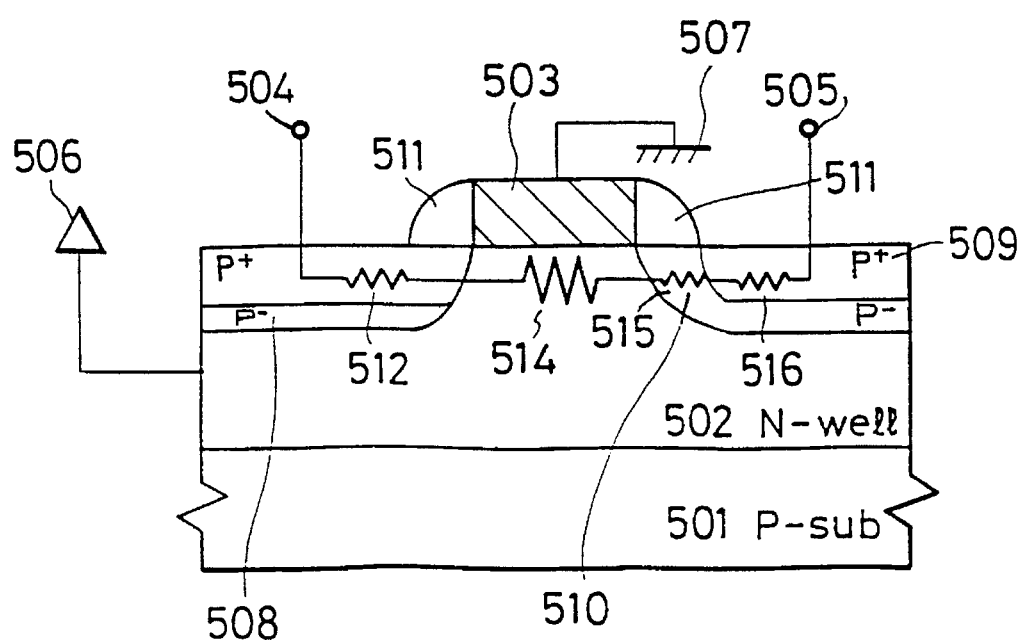
FIG. 6 is a schematic view illustrating a P-channel MOS transistor including an asymmetrical LDD structure.
Figure 3:
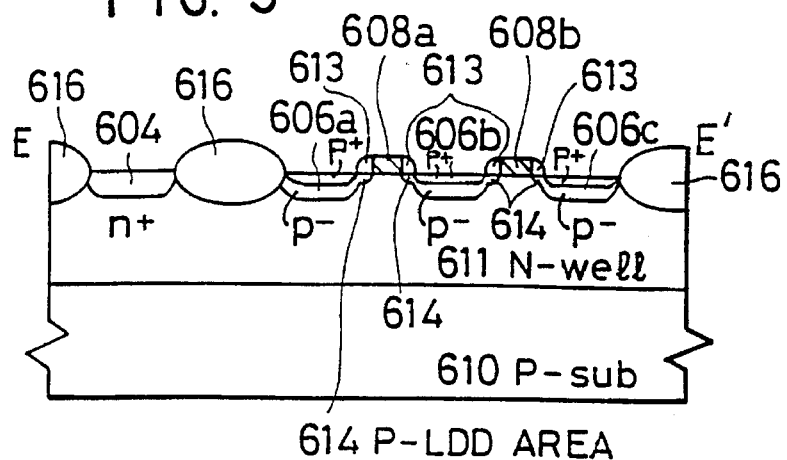
FIG. 3 is a cross-sectional view taken along the line A—A in FIG. 2.
Figure 5:
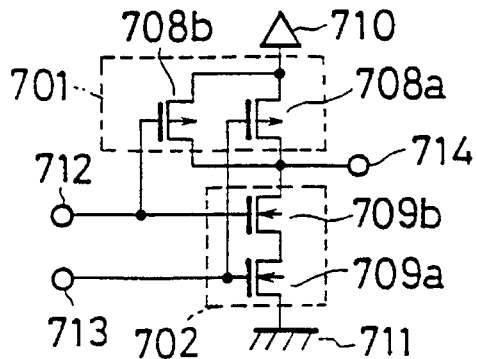
FIG. 5 is an equivalent circuit diagram to the circuit of FIG. 4.

FIG. 6 illustrates a P-channel MOS transistor for showing resistors included in an asymmetrical LDD transistor. In the illustrated asymmetrical LDD transistor, a source diffusion layer is extended to be located beneath a sidewall of a source, to thereby eliminate the resistor 813 (see FIG. 1) which have been present in the source-side LDD area of a symmetrical LDD transistor.

Figure 7:
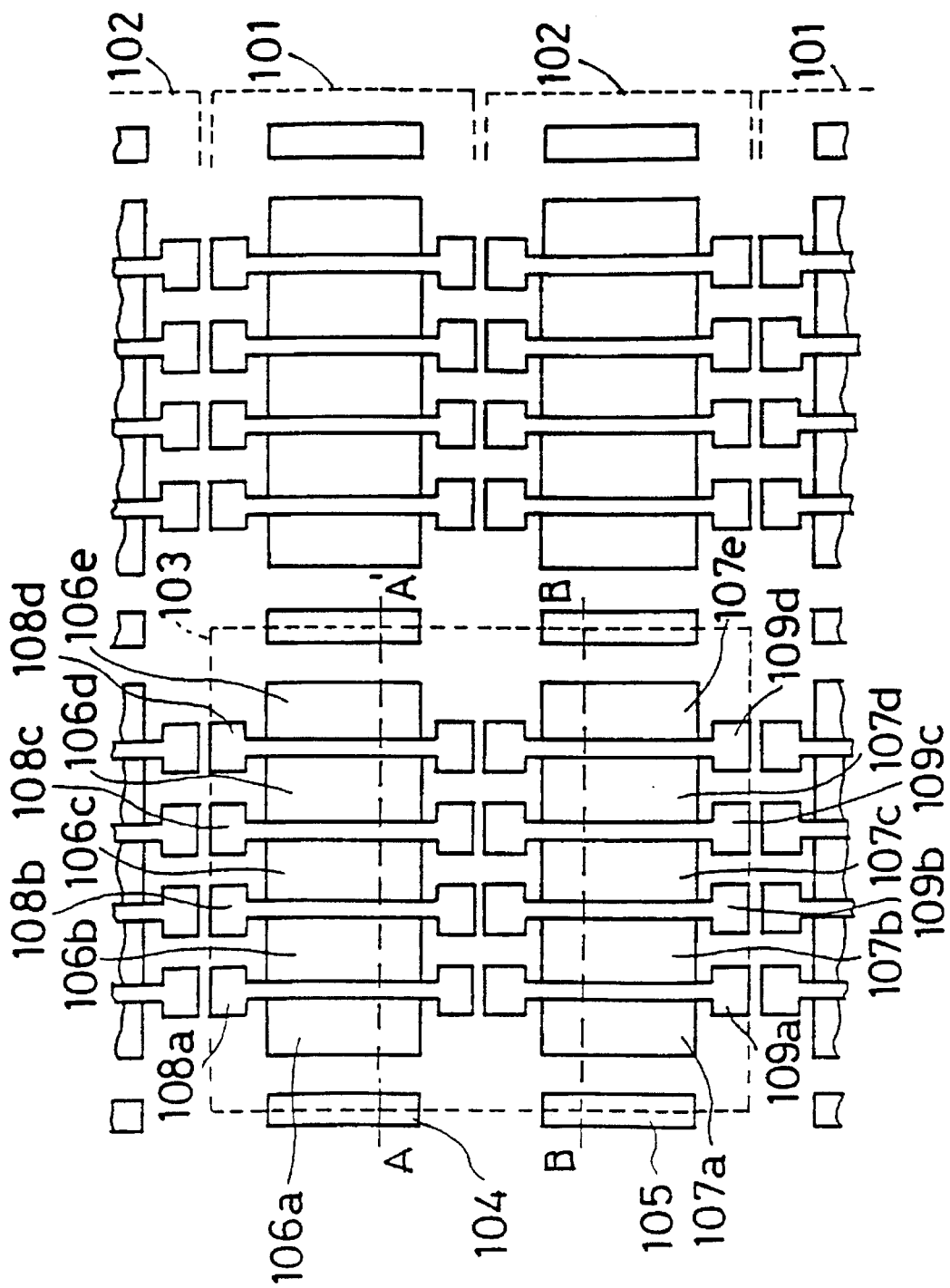
FIG. 7 is a top plan view of a basic cell array of a semiconductor integrated circuit in accordance with a first embodiment of the present invention.
Figure 8:
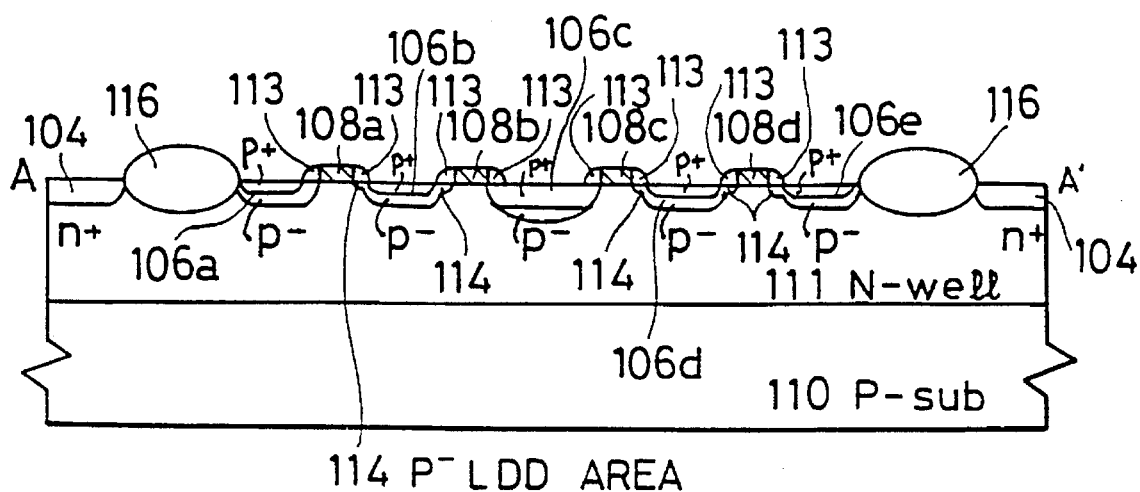
FIG. 8 is a cross-sectional view taken along the line B—B in FIG. 7.
Figure 9:
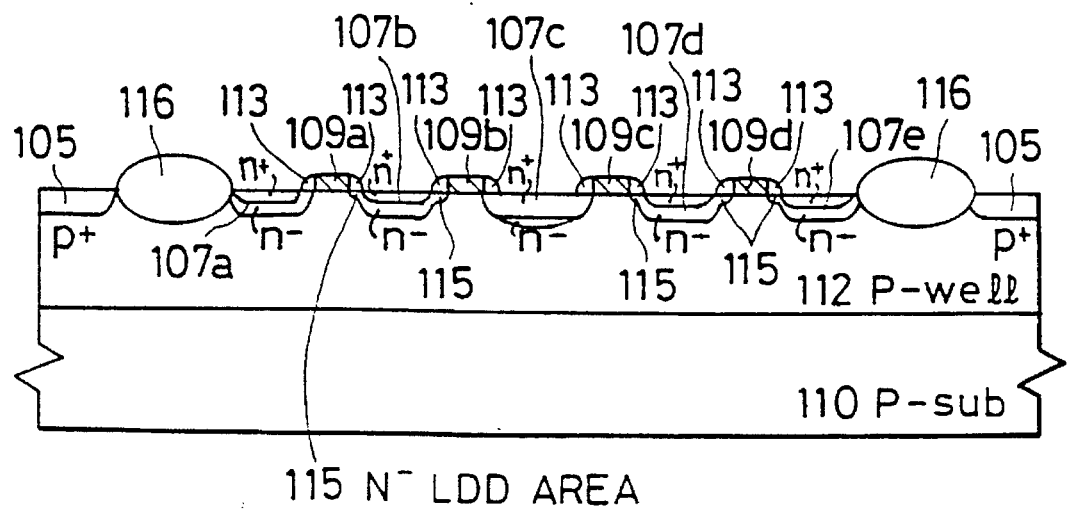
FIG. 9 is a cross-sectional view taken along the line C—C in FIG. 7.

FIGS. 7 to 9 illustrate a basic cell array of a semiconductor integrated circuit in accordance with a first embodiment. A basic cell 103 in the first embodiment comprises four P-channel MOS transistors 108b, 108c, 108d and 108a and four N-channel MOS transistors 109b, 109c, 109d and 109a.

With reference to FIGS. 8 and 9 which are cross-sectional views of the P-channel MOS transistors 108b, 108c, 108d and 108a, and the N-channel MOS transistors 109b, 109c, 109d, and 109a, respectively, the three P-channel MOS transistors 108a, 108b and 108c and the three N-channel MOS transistors 109a, 109b and 109c being arranged nearer well contact diffusion layers 104 and 105, respectively, are asymmetrical LDD transistors, whereas the remaining P-channel MOS transistor 108d and N-channel MOS transistor 109d are symmetrical LDD transistors.

Figure 11:
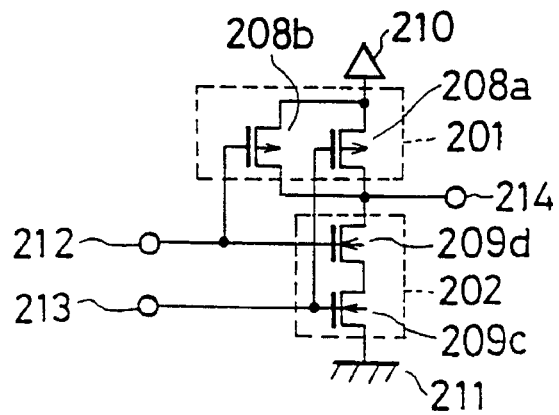
FIG. 11 is an equivalent circuit diagram to the circuit of FIG. 10.

FIG. 10 is a layout of a basic cell array of FIG. 7 to which is applied a double inputs NAND. FIG. 11 is an equivalent circuit diagram of the double inputs NAND. In this layout of FIG. 10, as illustrated in FIG. 11, only a N-channel MOS transistor 209d connected to an output terminal comprises conventional LDD transistors having a symmetrical structure. Thus, since the two asymmetrical LDD transistors are connected in parallel to each other, an on-current is increased, particularly at a start-up, by about 10% relative to a conventional layout. Hence, the drivability of the circuit against loads can be enhanced.

In a circuit illustrated in FIG. 10, four transistors 208c, 208d, 209a and 209b are not used, and hence unnecessary for the circuit. Namely, a circuit in accordance with the invention may have unnecessary transistors and further have a larger cell area than a conventional circuit as illustrated in FIG. 2. However, it should be noted that a basic cell structure in accordance with the invention does not disadvantageously affect the integration, because the integration concentration of a recent LSI is dominantly directed to the integration of lead wires.

Figure 12:
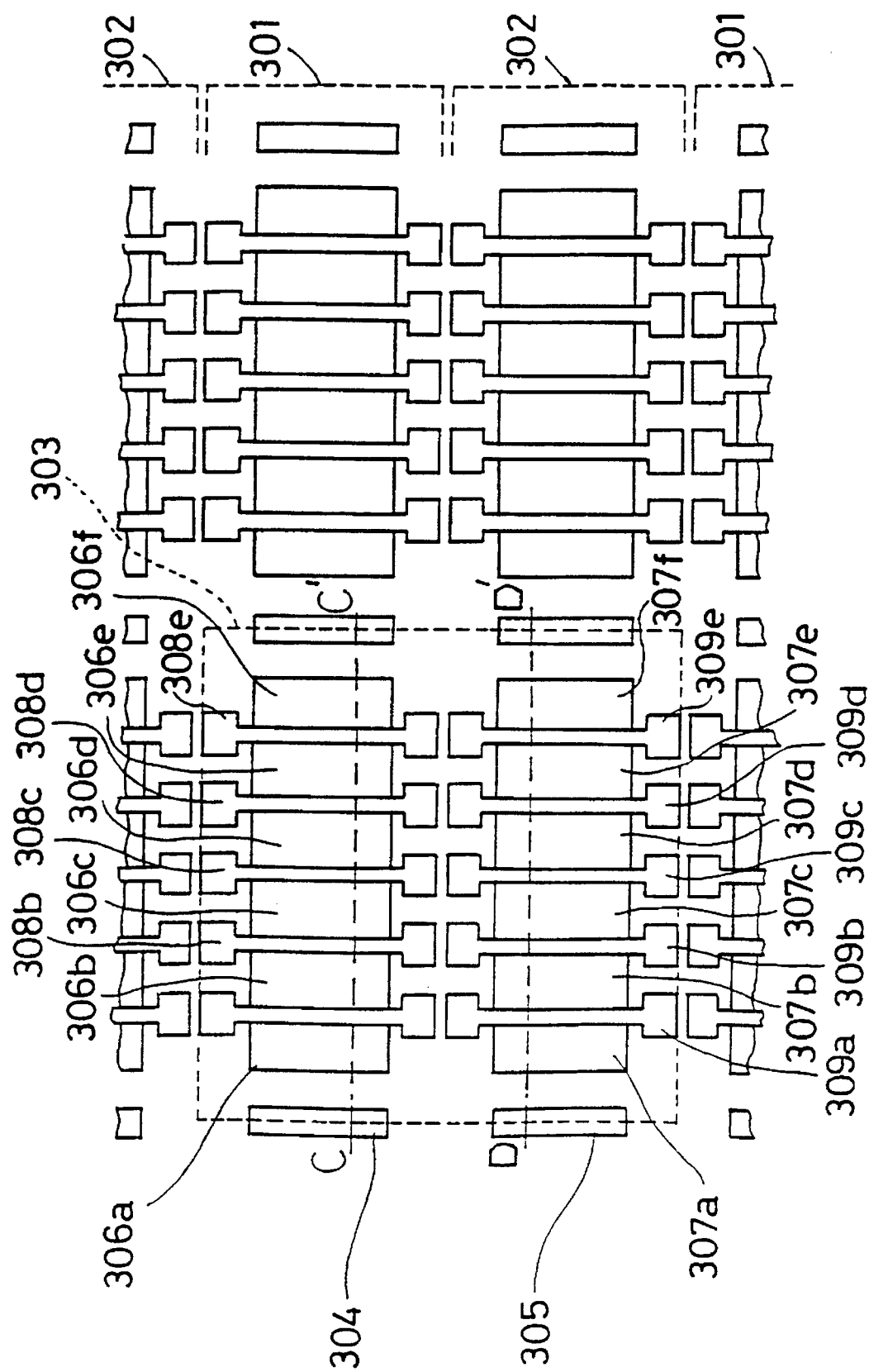
FIG. 12 is a top plan view of a basic cell array of a semiconductor integrated circuit in accordance with a second embodiment of the present invention.
Figure 13:
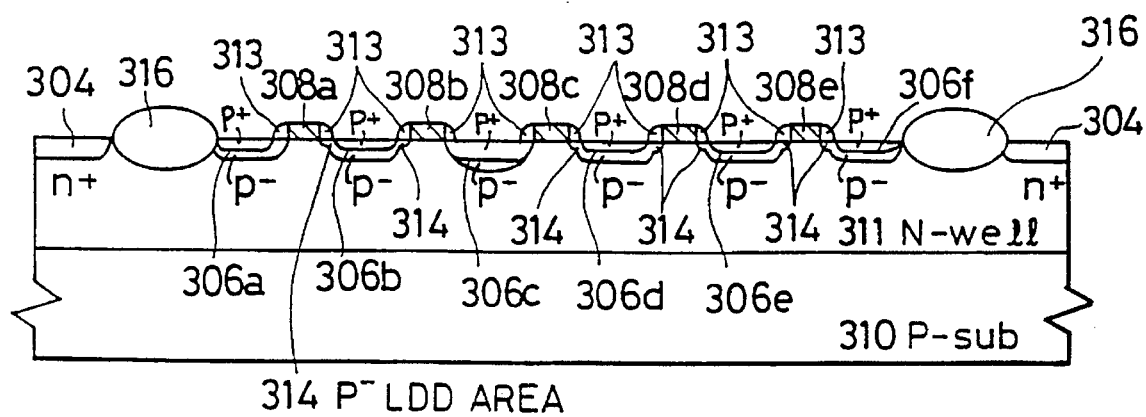
FIG. 13 is a cross-sectional view taken along the line D—D in FIG. 12.
Figure 14:
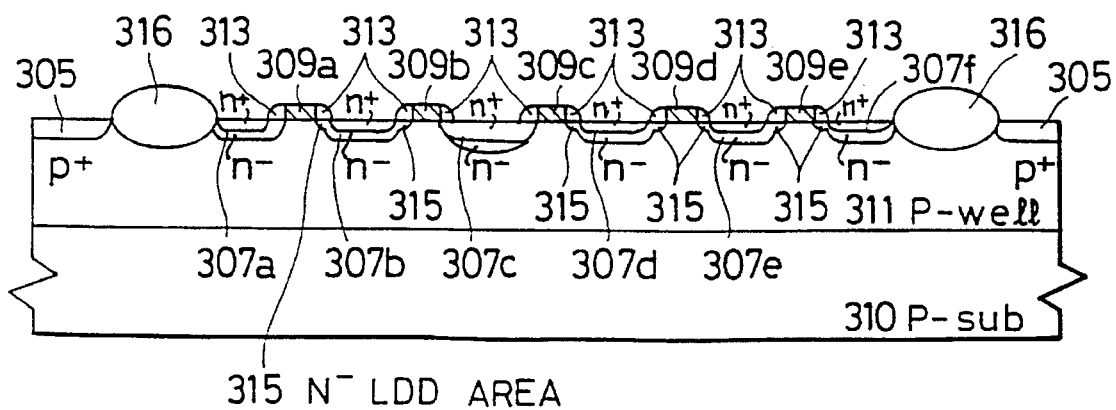
FIG. 14 is a cross-sectional view taken along the line E—E in FIG. 12.

FIGS. 12 to 14 illustrate a second embodiment in accordance with the invention. As illustrated in FIG. 12, a basic cell 303 in the embodiment comprises five P-channel MOS transistors 308a, 308b, 308c, 308d and 308e, and five N-channel MOS transistors 309a, 309b, 309c, 309d and 309e.

With reference to FIGS. 13 and 14 which are cross-sectional views taken along the lines D—D and E—E of FIG. 12, respectively, three P-channel MOS transistors 308a, 308b and 308c disposed nearer a N-well contact diffusion layer 304 and three N-channel MOS transistors 309a, 309b and 309c disposed nearer a P-well contact diffusion layer 305 are all LDD transistors having an asymmetrical structure, whereas the remaining two P-channel MOS transistors 308d and 308e and N-channel MOS transistors 309d and 309e are LDD transistors having a symmetrical structure.

Figure 16:
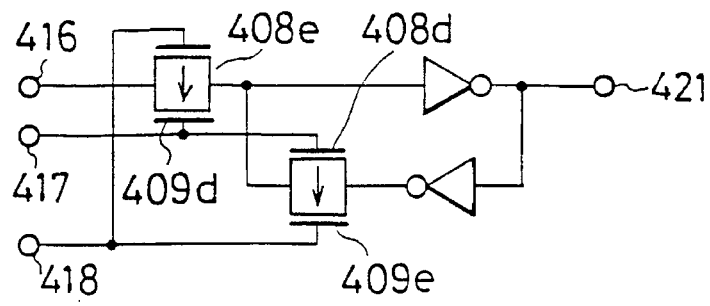
FIG. 16 is an equivalent circuit diagram to the circuit of FIG. 15.
Figure 4:
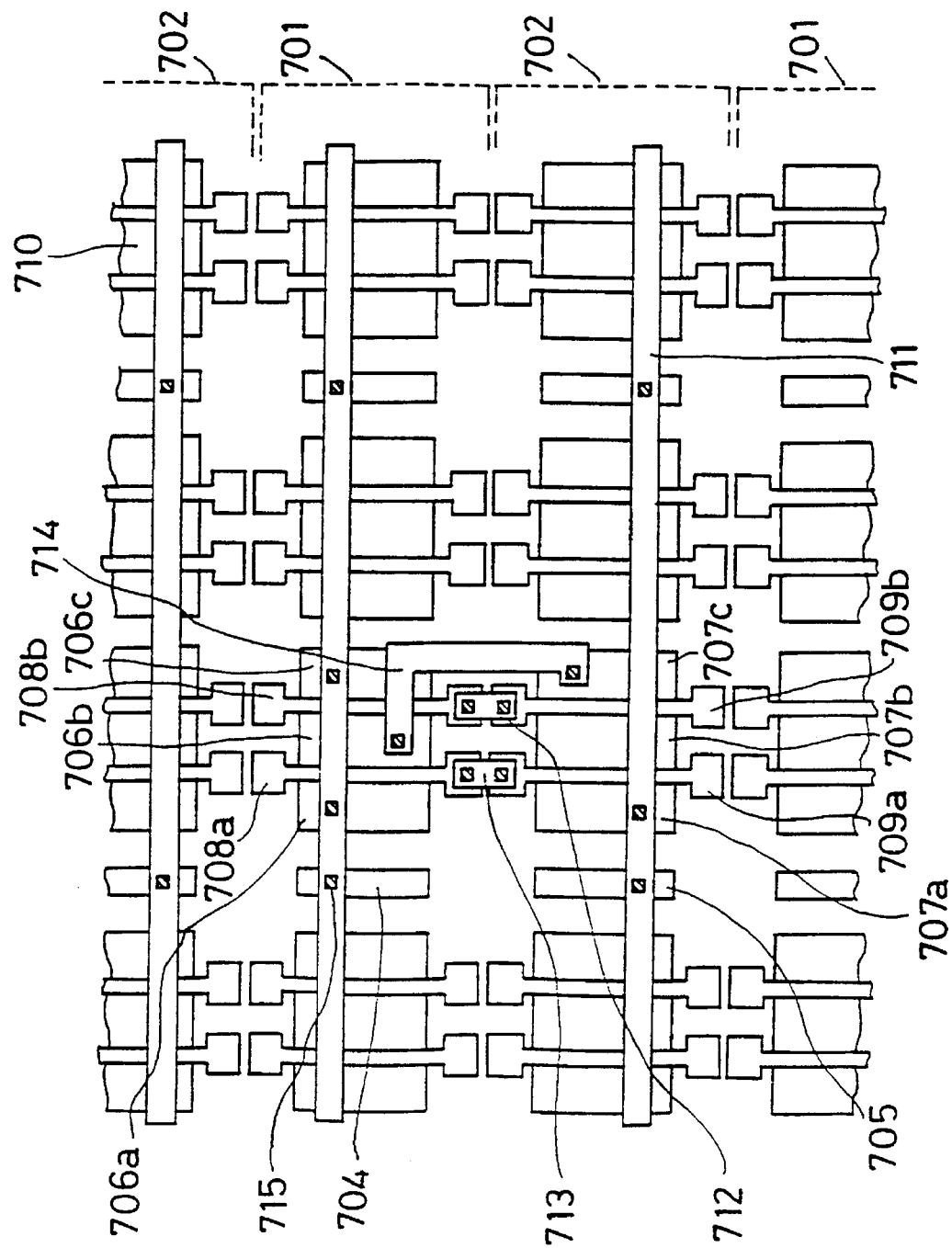
FIG. 4 is a top plan view illustrating a conventional SOG applied to a double inputs NAND circuit.
Figure 15:
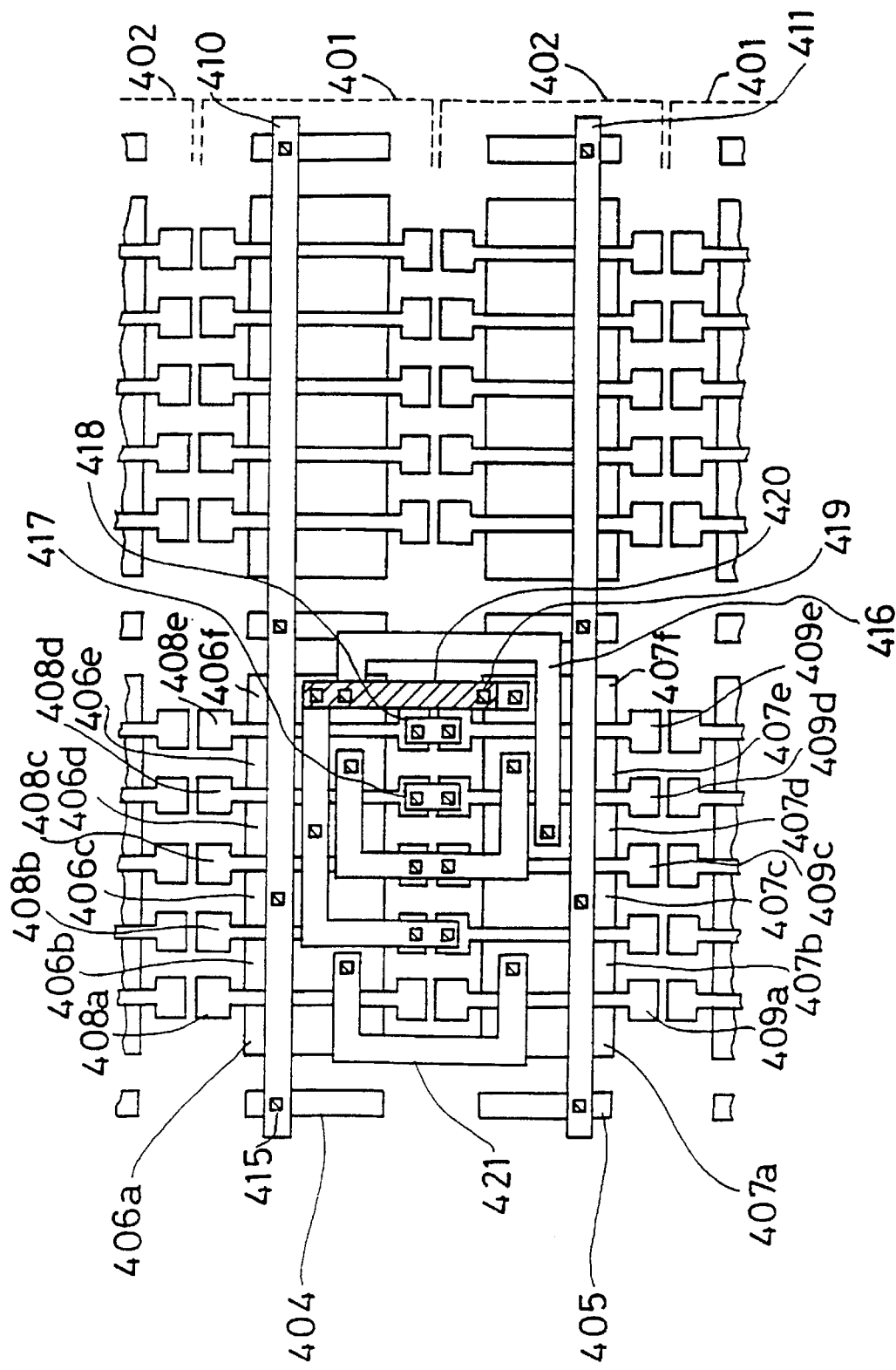
FIG. 15 is a top plan view illustrating a circuit in accordance with the second embodiment, applied to a latch circuit.

FIG. 15 illustrates a circuit having the basic cell arrays of FIG. 12 to which a latch circuit is applied, and FIG. 16 is a diagram of a circuit equivalent to the latch circuit. In the illustrated circuit, two CMOS transfer gates illustrated in FIG. 16 comprise conventional LDD transistors 408d, 408e and 409d, 409e each having a symmetrical structure, whereas the other two inverter circuits comprise LDD transistors 408b, 408c and 409b, 409c each having an asymmetrical structure.

In the second embodiment, it is possible to compose a latch circuit of a single basic cell. Similarly, it is also possible to compose a master/slave type flip-flop circuit of two basic cells.

It should be noted that each of the P-channel and N-channel MOS transistors 408d, 408e and 409d, 409e in the basic cell are indispensable for composing a transfer gate.

Although the first and second embodiments use LDD transistors having a symmetrical and/or asymmetrical structure, those skilled in the art could easily understand that the first and second embodiments would have the same advantages even if they would use DDD transistors having a symmetrical and/or asymmetrical structure.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor integrated circuit comprising:

a substrate; and a plurality of block cells arranged on said substrate and including a plurality of basic cells, each of said basic cells including a plurality of complementary-metal-oxide-semiconductor transistors, at least one of said complementary-metal-oxide-semiconductor (CMOS) transistors having an asymmetrical structure in which only a drain diffusion layer has a lightly doped drain structure, at least one of said complementary-metal-oxide-semiconductor (CMOS) transistors is a first symmetrical complementary-metal-oxide-semiconductor (CMOS) transistor in which both a source diffusion layer and a drain diffusion layer have a lightly doped drain (LDD) structure or a double diffused drain (DDD) structure, at least one of said complementary-metal-oxide-semiconductor (CMOS) transistors is a second symmetrical complementary-metal-oxide-semiconductor (CMOS) transistor in which both a source diffusion layer and a drain diffusion layer have a single drain structure, and each of said basic cells includes a larger number of said asymmetrical complementary-metal-oxide-semiconductor (CMOS) transistors than a total number of said first and second symmetrical complementary-metal-oxide-semiconductor (CMOS) transistors.

2. The semiconductor integrated circuit as recited in claim 1, wherein each of said complementary-metal-oxide-semiconductor (CMOS) transistors includes P-channel complementary-metal-oxide-semiconductor (CMOS) transistors and N-channel complementary-metal-oxide-semiconductor (CMOS) transistors.

3. A semiconductor integrated circuit comprising:

a substrate; and a plurality of block cells arranged on said substrate and including a plurality of basic cells, each of said basic cells including a plurality of complementary-metal-oxide-semiconductor (CMOS) transistors;

at least one of said complementary-metal-oxide-semiconductor (CMOS) transistors having an asymmetrical structure in which a source diffusion layer is extended to be located beneath a sidewall on a source side, and a lightly doped drain (LDD) structure or a double diffused drain (DDD) structure being beneath a sidewall on a drain side, at least one of said complementary-metal-oxide-semiconductor (CMOS) transistors is a first symmetrical complementary-metal-oxide-semiconductor (CMOS) transistor in which both a source diffusion layer and a drain diffusion layer are formed so that they are not located beneath sidewalls of a source and a drain, and so that they have a lightly doped drain (LDD) structure or a double diffused drain (DDD) structure beneath said sidewalls of a source and a drain, at least one of said complementary-metal-oxide-semiconductor (CMOS) transistors is a second symmetrical complementary-metal-oxide-semiconductor (CMOS) transistor in which both a source diffusion layer and a drain diffusion layer have a single drain structure, and each of said basic cells includes a larger number of said asymmetrical complementary-metal-oxide-semiconductor (CMOS) transistors than a total number of said first and second symmetrical complementary-metal-oxide-semiconductor (CMOS) transistors.

4. The semiconductor integrated circuit as recited in claim 3, wherein each of said complementary-metal-oxide-semiconductor (CMOS) transistors includes P-channel complementary-metal-oxide-semiconductor (CMOS) transistors and N-channel complementary-metal-oxide-semiconductor (CMOS) transistors.

* * * * *